US011295968B2

(12) United States Patent
Tang

(10) Patent No.: US 11,295,968 B2
(45) Date of Patent: Apr. 5, 2022

(54) SYSTEM AND METHOD FOR DECAPSULATION OF PLASTIC INTEGRATED CIRCUIT PACKAGES

(71) Applicant: JIACO Instruments Holding B.V., Delfgauw (NL)

(72) Inventor: Jiaqi Tang, Delft (NL)

(73) Assignee: JIACO Instruments Holding B.V., Delfgauw (NL)

( * ) Notice: Subject to any disclaimer, the term of this patent is extended or adjusted under 35 U.S.C. 154(b) by 60 days.

(21) Appl. No.: 15/697,175

(22) Filed: Sep. 6, 2017

(65) Prior Publication Data
US 2017/0365494 A1    Dec. 21, 2017

Related U.S. Application Data

(63) Continuation of application No. PCT/NL2016/050145, filed on Mar. 3, 2016.

(30) Foreign Application Priority Data

Mar. 6, 2015    (NL) ..................... 2014415

(51) Int. Cl.
| | | |
|---|---|---|
| *H01L 21/67* | (2006.01) | |
| *H01J 37/32* | (2006.01) | |
| *H05H 1/46* | (2006.01) | |

(52) U.S. Cl.
CPC .... *H01L 21/67126* (2013.01); *H01J 37/3222* (2013.01); *H01J 37/32247* (2013.01);
(Continued)

(58) Field of Classification Search
CPC ............. H01J 37/3222; H01J 37/32247; H01J 37/32256; H01J 37/32348; H01L 21/67126; H05H 1/46
(Continued)

(56) References Cited

U.S. PATENT DOCUMENTS

| | | | | |
|---|---|---|---|---|
| 3,778,656 A | * | 12/1973 | Fremiot | H01J 27/18 313/363.1 |
| 4,902,099 A | * | 2/1990 | Okamoto | G01N 21/73 219/121.36 |

(Continued)

FOREIGN PATENT DOCUMENTS

| | | |
|---|---|---|
| WO | 2013/184000 | 12/2013 |
| WO | 2014/111469 | 7/2014 |
| WO | 2016/144159 | 9/2016 |

OTHER PUBLICATIONS

Tang, et al., "Optimization of the Microwave Induced Plasma system for failure analysis in integrated circuit packaging", Electronic Packaging Technology & High Density Packaging (ICEPT-HDP), 2010 11th International Conference on, IEEE, 2010, 1034-1038.

*Primary Examiner* — Lan Vinh
(74) *Attorney, Agent, or Firm* — Peacock Law P.C.; Justin Muehlmeyer

(57) ABSTRACT

System and method for decapsulation of plastic integrated circuit packages by providing a microwave generator, providing a Beenakker resonant cavity connected to the microwave generator, which cavity comprises a coupling antenna loop, providing the cavity with a tube or tubes for supply of plasma gas and etchant gas or gases and with means for igniting the plasma gas, and providing that the cavity is set at a predefined value of its Q factor by embodying the coupling antenna loop and/or a wire optionally attached to the coupling antenna loop in a metal or metal alloy, or providing that at least at part of its surface area the coupling antenna loop and/or the wire is coated with a metal or metal alloy different than copper and with a higher resistivity than copper.

21 Claims, 3 Drawing Sheets

(52) U.S. Cl.
CPC .. *H01J 37/32256* (2013.01); *H01J 37/32348* (2013.01); *H05H 1/46* (2013.01)

(58) Field of Classification Search
USPC ............ 438/696, 726, 728, 106; 156/345.35, 156/345.36, 345.46, 345.49
See application file for complete search history.

(56) References Cited

U.S. PATENT DOCUMENTS

| | | | | |
|---|---|---|---|---|
| 4,965,540 | A * | 10/1990 | Sullivan | G01N 21/68 333/13 |
| 8,558,705 | B2 * | 10/2013 | Gong | G01N 22/02 340/584 |
| 2004/0118348 | A1 * | 6/2004 | Mills | G21K 1/00 118/723 MW |
| 2006/0175302 | A1 * | 8/2006 | Kuo | H05H 1/30 219/121.36 |
| 2008/0106272 | A1 * | 5/2008 | Maier | F15B 15/2869 324/644 |
| 2009/0027280 | A1 * | 1/2009 | Frangioni | A61K 49/18 343/703 |
| 2013/0015766 | A1 * | 1/2013 | Taghioskoui | H05H 1/46 315/111.41 |
| 2013/0084706 | A1 | 4/2013 | Zhao et al. | |

\* cited by examiner

SYSTEM AND METHOD FOR DECAPSULATION OF PLASTIC INTEGRATED CIRCUIT PACKAGES

CROSS-REFERENCE TO RELATED APPLICATIONS

This application is a continuation application of Patent Cooperation Treaty Application No. PCT/NL2016/050145, filed on Mar. 3, 2016, which claims priority to Netherlands Patent Application No. 2014415, filed on Mar. 6, 2015, and the specifications and claims thereof are incorporated herein by reference.

STATEMENT REGARDING FEDERALLY SPONSORED RESEARCH OR DEVELOPMENT

Not Applicable.

THE NAMES OF PARTIES TO A JOINT RESEARCH AGREEMENT

Not Applicable.

INCORPORATION BY REFERENCE OF MATERIAL SUBMITTED ON A COMPACT DISC

Not Applicable.

STATEMENT REGARDING PRIOR DISCLOSURES BY THE INVENTOR OR A JOINT INVENTOR

Not Applicable.

COPYRIGHTED MATERIAL

Not Applicable.

BACKGROUND OF THE INVENTION

Field of the Invention (Technical Field)

The present invention relates to a system for decapsulation of plastic integrated circuit packages, comprising a microwave generator, a Beenakker resonant cavity connected to the microwave generator, wherein the said Beenakker cavity has a predefined Q factor and is provided with a tube or tubes for supply of plasma gas and etchant gas or gases and with means for igniting the plasma gas, which Beenakker resonant cavity comprises a coupling antenna loop which is optionally provided with a wire attached to the coupling antenna loop. The Beenakker resonant cavity is in the scientific literature known as the so-called "Beenakker-type TM010-mode microwave resonant cavity". The invention also relates to a method which can be implemented with the system, and the invention relates to a separate Beenakker cavity.

Description of Related Art Including Information Disclosed Under 37 C.F.R. §§ 1.97 and 1.98

A system, method and Beenakker cavity are known from the article "Optimization of the Microwave Induced Plasma System for Failure Analysis in Integrated Circuit Packaging" by J. Tang, J. B. J. Schelen, and C. I. M. Beenakker, 2010 11th International Conference on Electronic Packaging Technology & High Density Packaging, pages 1034-1038. According to this article the wire that may be attached to the coupling antenna loop is a copper wire.

The article discloses that decapsulation of plastic IC packages is performed for failure analysis. The goal of decapsulation is to remove only the mold compound and to keep the underlying wire bond and die intact so that these can be subjected to further analysis.

Generally speaking, there are two major concerns for a decapsulation method. One is selectivity, which determines the potential damage to the wire bond and die. The other is the etching rate, which determines how fast the IC package can be fully decapsulated. It is hard to meet both requirements simultaneously because in practice they are often found contradictory, especially when it comes to copper wire bond package decapsulation.

The trend in IC packaging is however to use copper as wire bond material due to its good performance and economic advantage. When copper wire bond material is used conventional failure analysis techniques like Xray-analysis and hot nitric acid decapsulation are not suitable.

X-ray analysis relies on the fact that absorption of X-rays by different materials is different. With copper wire bond packages, the wire bond and lead frame material are all made of copper, making it virtually impossible to distinguish the two components.

Hot nitric acid decapsulation generally shows good selectivity and a high etching rate for decapsulation of gold wire bond IC packages. For IC packages that use copper wire bonds, this method is not appropriate. Although modifying the acid mixture composition and process temperature can help to improve the process' selectivity in etching, the copper wire bond is still etched and easily damaged during the decapsulation process.

The article further discusses plasma etching as a new and potential technique for IC package decapsulation. Radicals in the plasma can be used to react with epoxy materials in the mold compound of the packaging. By varying the gas mixture compositions, plasma etching can give high selectivity when etching different materials. This high selectivity property makes the method of plasma etching a potentially ideal choice for decapsulation of copper wire bond IC packages.

There are however also some drawbacks with plasma etching. The etch rate of plasma etching is low. Plasma etching systems are commonly used to etch photoresists during IC fabrication. Such system usually uses radiofrequency (13.56 MHz) oxygen plasma, and the etch rate of the epoxy materials is around 1 to 5 micrometer/min. In the mold compound, epoxy material only accounts for about 10~40% mass percentage while the silica filler accounts for about 60~90%. Because the silica filler does not react with oxygen radicals generated in the plasma, the etch rate of the mold compound in performing plasma etching is even lower.

The article discloses a microwave induced plasma (MIP) system that uses a Beenakker type microwave resonant cavity to sustain an atmospheric plasma for IC package decapsulation. Both the selectivity and the etch rate of this MIP system is high.

According to this article the system operates at atmospheric pressure and comprises a microwave generator (f=2.45 GHz, P<120 W), a Beenakker type microwave resonant cavity, and gas connections. Microwave power is coupled from the generator to the cavity by an antenna loop inside the cavity. An electrical field is generated in the cavity, and a gas discharge tube is inserted through a hole in the center of the cavity for the supply of plasma gas and etching gases. The plasma gas (notably Argon) can be ignited by an electrical coil and sustained by the cavity at power ranges from 20 W to 120 W. Following ignition of the plasma gas, etching gases (notably O2 and CF4) can be added into the plasma. An IC package sample is placed below the gas discharge tube so that the effluent of the plasma can be used for etching.

A known problem is that without additional measures there will be more than 50% power reflection in the plasma, which is harmful to the sustainability of the plasma and should therefore be avoided. For this purpose, the Beenakker cavity can according to the article be provided with a copper wire attached to the coupling antenna loop and like the antenna also be made of copper. The length of the copper wire is for instance 1 cm and the diameter of the wire is for instance 0.1 cm, resulting in that the copper wire attached to the coupling antenna loop has a length-width-ratio of approximately 10. By this measure the microwave power reflection can be decreased from 50% to less than 15%.

Nevertheless, when adding etching gases like oxygen (O2) or carbontetrafluoride (CF4) gas into the plasma, the plasma becomes disturbed and becomes unstable. When a small amount of etching gases O2 or CF4 is added, the power reflection raises drastically. When more than 0.5% of the etching gases O2 or CF4 is added, the plasma will become unstable and extinguish. This is a major problem since for plasma etching applications, approximately 1% etching gases O2 or CF4 have to be added into the plasma to achieve satisfactory etching rates.

BRIEF SUMMARY OF THE INVENTION

It is an object of the invention to alleviate this problem that the plasma is unstable and will extinguish, and to provide a system, method and Beenakker cavity which can satisfactorily be applied to provide a stable plasma for decapsulation of plastic integrated circuit packages.

Accordingly, the invention proposes such a system, method and Beenakker cavity which are embodied with the features of one or more of the appended claims.

Further scope of applicability of the present invention will be set forth in part in the detailed description to follow, taken in conjunction with the accompanying drawings, and in part will become apparent to those skilled in the art upon examination of the following, or may be learned by practice of the invention. The objects and advantages of the invention may be realized and attained by means of the instrumentalities and combinations particularly pointed out in the appended claims.

BRIEF DESCRIPTION OF THE SEVERAL VIEWS OF THE DRAWINGS

The accompanying drawings, which are incorporated into and form a part of the specification, illustrate one or more embodiments of the present invention and, together with the description, serve to explain the principles of the invention. The drawings are only for the purpose of illustrating one or more embodiments of the invention and are not to be construed as limiting the invention. In the drawings.

DETAILED DESCRIPTION OF THE INVENTION

Figure 1:
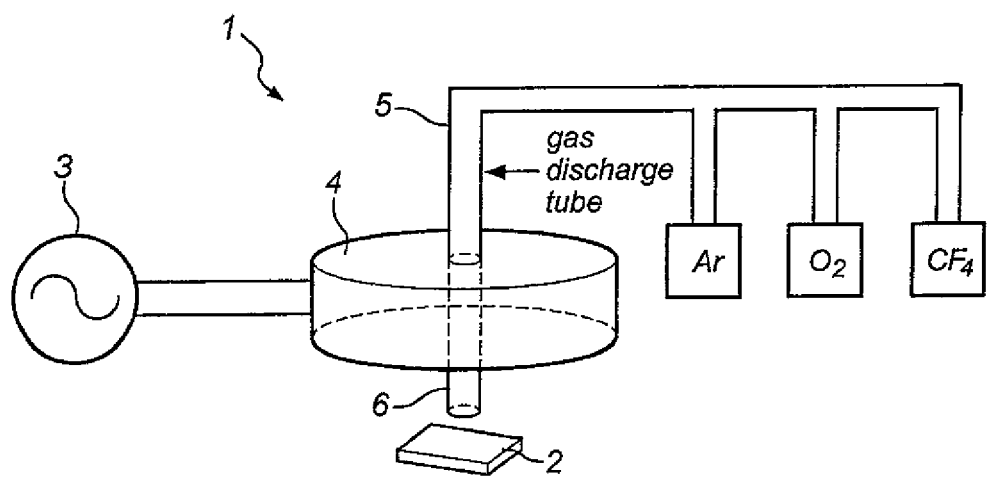
FIG. 1 depicts a schematic representation of a system according to the invention.

The invention is based on an insight that by intentionally reducing the Q factor of the Beenakker resonant cavity its bandwidth is widened, and the cavity is less sensitive for the disturbing contribution of the supplied etching gases. According to the invention the system for decapsulation of plastic integrated circuit passages is therefore provided with a Q factor of the Beenakker resonant cavity which is set at a predefined value by arranging that the coupling antenna loop and/or the said wire optionally attached to the coupling antenna loop is implemented in a metal or metal alloy different than copper and with a higher resistivity than copper ($1.724 \times 10^{-8}$ ohm·m), or that at least at part of its surface area the coupling antenna loop and/or the said wire is provided with a coating of a metal or metal alloy different than copper and with a higher resistivity than copper ($1.724 \times 10^{-8}$ ohm·m). If a metal or metal alloy coating is applied to the wire, the core of the wire may be made of metal or of a nonmetal, and even in a material such as glass. With this configuration, the plasma can be stable while adding etching gases in the amount of 8%. In comparison: if the coupling antenna loop and the wire which is optionally attached to the coupling antenna loop is made of copper, the addition of 1% etching gas makes that the plasma becomes unstable and extinguishes.

Although in the foregoing Argon is mentioned as the gas for the plasma and O2 and CF4 are mentioned as etching gases, it is also possible to apply other suitable gases such as Helium for the plasma, and CO2, C2F6, C3F8, CHF3, SF6, CF3Cl, Cl2, N2 as etching gases. In principle any suitable etchant gas can be regarded and applied, while the plasma will be stable when operating according to the invention, no matter the etching gas composition.

By applying the features of the invention, the resonant spectrum broadens of the system and Beenakker cavity in comparison with the spectrum of the system and Beenakker cavity according to the prior art, so that more etchant gas can be added into the plasma without detuning the cavity and cause instability of the plasma. The invention avoids the application of any tuning rods which are known to be applied to control a plasma's spatial uniformity as disclosed in US2013/0084706. The invention has however nothing to do with controlling the plasma's spatial uniformity, but is aimed at improving the plasma's stability when etching gases are added to the plasma.

It is preferable that the coupling antenna loop and/or the said wire optionally attached to the coupling antenna loop is made in a metal or metal alloy or has at least at part of its surface area a coating of a metal or metal alloy with a resistivity in the range of $4.0\text{-}17.0 \times 10^{-8}$ ohm·m. This ensures an appropriate balance in the reduction of microwave power due to the decreased Q factor on the one hand, and the required maintenance and stability of the plasma in the Beenakker cavity on the other hand.

Suitably the coupling antenna loop and/or or the said wire optionally attached to the coupling antenna loop is made of a metal or coated with a metal selected from the group comprising cadmium, chromium, cobalt, iron, iridium, lithium, magnesium, molybdenum, nickel, niobium, osmium, palladium, platinum, selenium, tantalum, tin, tungsten, or of any alloy of these materials.

Appropriate results at low costs are achieved when the metal of the coupling antenna loop and/or or the said copper wire that is optionally attached to the coupling antenna loop, is tin-coated copper.

The benefits of the invention can be promoted by arranging that an electrical field disturbing clip is mounted on the coupling antenna loop and/or or the said wire that is optionally attached to the coupling antenna loop. This can be applied with same effect independent from any and each of the other features of the system according to the invention for tuning the system's Q factor.

Corresponding with the foregoing disclosure the invention is also embodied in a method for decapsulation of plastic integrated circuit packages, comprising the steps of:
 providing a microwave generator;
 providing a Beenakker resonant cavity connected to the microwave generator, which Beenakker resonant cavity comprises a coupling antenna loop;
 providing the Beenakker resonant cavity with a tube or tubes for supply of plasma gas and etchant gas or gases and with means for igniting the plasma gas;
 optionally providing a copper wire to the coupling antenna loop, and
 providing that the Beenakker resonant cavity is set at a predefined value of its Q factor by embodying the coupling antenna loop and/or the said wire optionally attached to the coupling antenna loop in a metal or metal alloy different than copper and with a higher resistivity than copper ($1.724 \times 10^{-8}$ ohm·m), or providing that at least at part of its surface area the coupling antenna loop and/or the said wire is coated with a metal or metal alloy different than copper and with a higher resistivity than copper ($1.724 \times 10^{-8}$ ohm·m).

Preferably the metal or metal alloy has a resistivity in the range of $4.0\text{-}17.0 \times 10^{-8}$ ohm·m. A suitable selection can be made from the group comprising cadmium, chromium, cobalt, iron, iridium, lithium, magnesium, molybdenum, nickel, niobium, osmium, palladium, platinum, selenium, tantalum, tin, tungsten, or any alloy of these materials. Preferably the metal of the coupling antenna loop and/or the said wire that is optionally attached to the coupling antenna loop is made of tin-coated copper. The benefits of the invention are promoted by disturbing an electrical field in the Beenakker cavity by mounting a clip on the coupling antenna loop and/or or the said wire that is optionally attached to the coupling antenna loop.

The invention will hereinafter be further discussed with reference to the attached drawings of a nonlimiting exemplary embodiment of a system according to the invention.

Whenever in the figures the same reference numerals are applied, these numerals refer to the same parts. It is further remarked that the figures resemble the figures shown in the above-mentioned article "Optimization of the Microwave Induced Plasma System for Failure Analysis in Integrated Circuit Packaging" by J. Tang, J. B. J. Schelen, and C. I. M. Beenakker, 2010 11th International Conference on Electronic Packaging Technology & High Density Packaging, pages 1034-1038. The figures are however deemed helpful in understanding the invention which basically concerns features that as such cannot be shown in a figure.

Referring first to FIG. 1 a system 1 is shown for decapsulation of one or more plastic integrated circuit packages 2.

The system 1 comprises a microwave generator 3, a Beenakker resonant cavity 4 connected to the microwave generator 3.

The Beenakker cavity 4 is provided with a supply tube 5 for supply of plasma gas (notably Ar) and etchant gas or gases (notably O2 and CF4). There are also (not shown) means for igniting the plasma gas by an electrical field. A preferable field strength distribution of this electrical field is shown in FIG. 3, which shows on the X-axis the radial position along the diameter of the Beenakker cavity 4 shown in FIG. 2, and along the Y-axis the electrical field strength at the respective radial positions. FIG. 3 shows that the electrical field has its highest strength in the central portion of the Beenakker cavity 4, at which also the plasma gas and etchant gases enter the cavity. At the bottom the Beenakker cavity 4 is provided with an exit tube 6 to release the effluent of the plasma towards the plastic integrated circuit package 2 underneath the cavity 4 and which is intended to be decapsulated.

Figure 2:
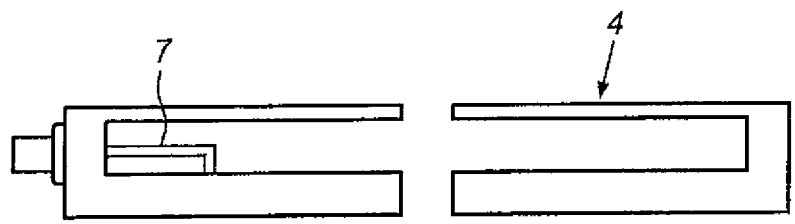
FIG. 2 shows a diametrical cross-section of a Beenakker cavity according to the invention.
Figure 3:
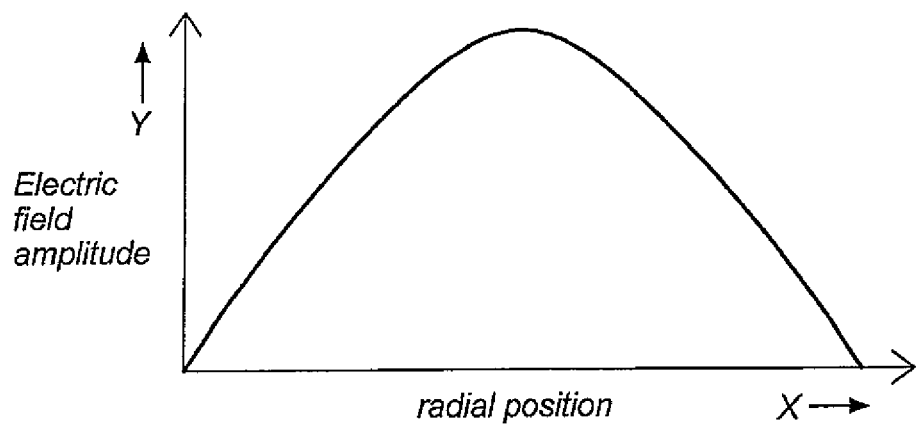
FIG. 3 depicts an electrical field distribution along the diameter of the Beenakker cavity shown in FIG. 2.
Figure 4:
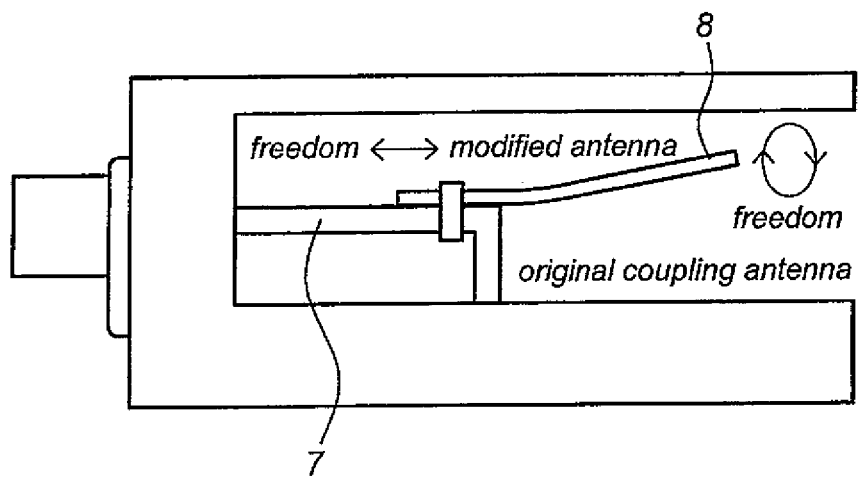
FIG. 4 depicts the Beenakker cavity shown in FIG. 2 completed with the optional copper wire attached to the coupling antenna loop of the Beenakker cavity.

FIG. 2 shows that the Beenakker resonant cavity 4 comprises a coupling antenna loop 7 which, according to what is shown in FIG. 4, can be optionally provided with a (copper or other material) wire 8 attached to the coupling antenna loop 7. Said wire 8 has a length-width-ratio of at least approximately 10, such as for instance a length of 1-2 cm and a diameter of 0.1 cm.

The invention is embodied in the feature that the Q factor of the Beenakker resonant cavity 4 is set at a predefined value by arranging that the coupling antenna loop 7 and/or the said wire 8 optionally attached to the coupling antenna loop 7 is implemented in a metal or metal alloy different than copper and with a higher resistivity than copper ($1.724 \times 10^{-8}$ ohm·m), or that at least at part of its surface area the coupling antenna loop 7 and/or the said wire 8 is provided with a coating of a metal or metal alloy different than copper and with a higher resistivity than copper ($1.724 \times 10^{-8}$ ohm·m).

Best results are achieved when the coupling antenna loop 7 and/or the said wire 8 optionally attached to the coupling antenna loop 7 is made in a metal or metal alloy or has at least at part of its surface area a coating of a metal or metal alloy with a resistivity in the range of $4.0\text{-}17.0 \times 10^{-8}$ ohm·m.

Based on this preferable range the material can be selected from the following table provided below (possible selections are underlined).

| Table of resistivity values (ohm · m) | |
|---|---|
| Aluminum | $2.65 \times 10^{-8}$ |
| Antimony | $41.8 \times 10^{-8}$ |
| Beryllium | $4.0 \times 10^{-8}$ |
| Bismuth | $115 \times 10^{-8}$ |
| Brass - 58%Cu | $5.9 \times 10^{-8}$ |
| Brass - 63%Cu | $7.1 \times 10^{-8}$ |
| Cadmium | $7.4 \times 10^{-8}$ |
| Carbon (graphite)[1] | $3\text{-}60 \times 10^{-5}$ |
| Cast iron | $100 \times 10^{-8}$ |
| Chromium | $13 \times 10^{-8}$ |
| Cobalt | $9 \times 10^{-8}$ |
| Constantan | $49 \times 10^{-8}$ |
| Copper | $1.724 \times 10^{-8}$ |
| Germanium[1] | $1\text{-}500 \times 10^{-3}$ |
| Gold | $2.24 \times 10^{-8}$ |
| Graphite | $800 \times 10^{-8}$ |
| Iridium | $5.3 \times 10^{-8}$ |
| Iron | $9.7 \times 10^{-8}$ |
| Lead | $20.6 \times 10^{-8}$ |
| Lithium | $9.28 \times 10^{-8}$ |
| Magnesium | $4.45 \times 10^{-8}$ |
| Manganese | $185 \times 10^{-8}$ |

-continued

Table of resistivity values (ohm · m)

| | |
|---|---|
| Mercury | $98.4 \times 10^{-8}$ |
| Mica | $1 \times 10^{13}$ |
| Mild steel | $15 \times 10^{-8}$ |
| Molybdenum | $5.2 \times 10^{-8}$ |
| Nickel | $6.85 \times 10^{-8}$ |
| Nickeline | $50 \times 10^{-8}$ |
| Nichrome (alloy of nickel and chromium) | $100\text{-}150 \times 10^{-8}$ |
| Niobium (Columbium) | $13 \times 10^{-8}$ |
| Osmium | $9 \times 10^{-8}$ |
| Palladium | $10.5 \times 10^{-8}$ |
| Phosphorus | $1 \times 10^{12}$ |
| Platinum | $10.5 \times 10^{-8}$ |
| Plutonium | $141.4 \times 10^{-8}$ |
| Rhodium | $4.6 \times 10^{-8}$ |
| Selenium | $12.0 \times 10^{-8}$ |
| Silver | $1.59 \times 10^{-8}$ |
| Sodium | $4.2 \times 10^{-8}$ |
| Solder | $15 \times 10^{-8}$ |
| Tantalum | $12.4 \times 10^{-8}$ |
| Thorium | $18 \times 10^{-8}$ |
| Tin | $11.0 \times 10^{-8}$ |
| Titanium | $43 \times 10^{-8}$ |
| Tungsten | $5.65 \times 10^{-8}$ |
| Uranium | $30 \times 10^{-8}$ |
| Vanadium | $25 \times 10^{-8}$ |
| Zinc | $5.92 \times 10^{-8}$ |

From this table, it follows that the coupling antenna loop 7 and/or or the said wire 8 optionally attached to the coupling antenna loop 7 is suitably made from a metal or coated with a metal selected from the group comprising cadmium, chromium, cobalt, iron, iridium, lithium, magnesium, molybdenum, nickel, niobium, osmium, palladium, platinum, selenium, tantalum, tin, tungsten, or any alloy of these materials.

From a cost perspective, the metal of the coupling antenna loop 7 and/or or the said copper wire 8 optionally attached to the coupling antenna loop 7 is preferably tin-coated copper.

One manner to further promote the benefits of the invention is to disturb an electrical field in the Beenakker cavity by mounting a clip on the coupling antenna loop 7 and/or the said wire 8 that is optionally attached to the coupling antenna loop 7. The way this should be implemented is clear to the skilled person and requires no further elucidation.

Figure 5:
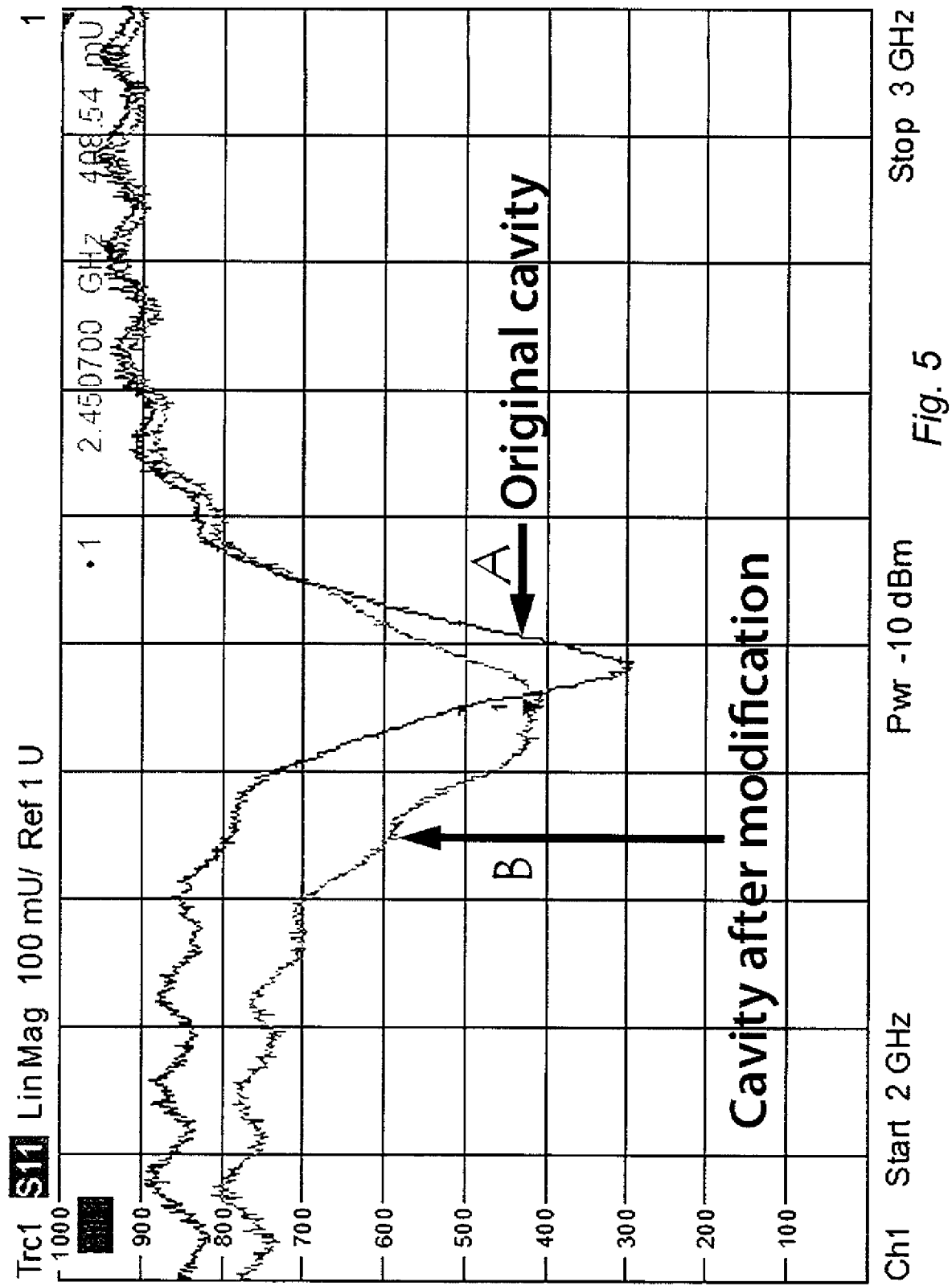
FIG. 5 provides a comparative graph of the resonance characteristics of a Beenakker cavity as modified according to the invention with a conventional Beenakker cavity.

Finally, reference is made to FIG. 5. FIG. 5 provides a comparative graph of resonance characteristics of a Beenakker cavity according to the prior art and a Beenakker cavity according to the invention. On the X axis, a frequency sweep of 2 GHz up to 3 GHz is shown, whereas on the Y axis the cavity's response in S11 parameter is shown. The graph indicated with arrow A relates to the response of the Beenakker cavity according to the prior art. The graph indicated with arrow B relates to the response of the Beenakker cavity according to the invention. Evidently the Beenakker cavity according to the invention exhibits a lower Q factor than the Beenakker cavity according to the prior art considering its lower peak and wider bandwidth. This lower Q factor is responsible for the improved stability of the plasma in the Beenakker cavity according to the invention when etching gases are supplied to the cavity.

Although the invention has been discussed in the foregoing with reference to an exemplary embodiment of the apparatus of the invention, the invention is not restricted to this particular embodiment which can be varied in many ways without departing from the gist of the invention. The discussed exemplary embodiment shall therefore not be used to construe the appended claims strictly in accordance therewith. On the contrary, the embodiment is merely intended to explain the wording of the appended claims without intent to limit the claims to this exemplary embodiment. The scope of protection of the invention shall therefore be construed in accordance with the appended claims only, wherein a possible ambiguity in the wording of the claims shall be resolved using this exemplary embodiment.

What is claimed is:

1. A system for decapsulation of plastic integrated circuit packages, comprising a microwave generator and a Beenakker resonant cavity connected to the microwave generator, wherein said Beenakker cavity has a predefined Q factor and is provided with a tube or tubes for supply of plasma gas and etchant gas or gases and with means for igniting the plasma gas, which Beenakker resonant cavity comprises a coupling antenna loop which is optionally provided with a wire attached to the coupling antenna loop, and wherein the Q factor of the Beenakker resonant cavity is set at a predefined value by arranging that the coupling antenna loop and/or said wire optionally attached to the coupling antenna loop is implemented in a metal or metal alloy different than copper and with a higher resistivity than copper ($1.724 \times 10^{-8}$ ohm·m), or that at least at part of its surface area the coupling antenna loop and/or said wire is provided with a coating of a metal or metal alloy different than copper and with a higher resistivity than copper ($1.724 \times 10^{-8}$ ohm·m).

2. The system according to claim 1, wherein the coupling antenna loop and/or said wire optionally attached to the coupling antenna loop is made in a metal or metal alloy or has at least at part of its surface area a coating of a metal or metal alloy with a resistivity in the range of $4.0\text{-}17.0 \times 10^{-8}$ ohm·m.

3. The system according to claim 1, wherein the coupling antenna loop and/or said wire optionally attached to the coupling antenna loop is made of a metal or coated with a metal selected from the group consisting of cadmium, chromium, cobalt, iron, iridium, lithium, magnesium, molybdenum, nickel, niobium, osmium, palladium, platinum, selenium, tantalum, tin, tungsten, and any alloy of these materials.

4. The system according to claim 3, wherein the coupling antenna loop and/or said wire optionally attached to the coupling antenna loop is made of tin-coated copper.

5. The system according to claim 1, wherein the Q factor of the Beenakker resonant cavity is set at a predefined value by arranging that an electrical field disturbing clip is mounted on the coupling antenna loop and/or said wire optionally attached to the coupling antenna loop.

6. A method for decapsulation of plastic integrated circuit packages, comprising the steps of:
   providing a microwave generator;
   providing a Beenakker resonant cavity connected to the microwave generator, which Beenakker resonant cavity comprises a coupling antenna loop;
   providing the Beenakker resonant cavity with a tube or tubes for supply of plasma gas and etchant gas or gases and with means for igniting the plasma gas;
   optionally providing a wire to the coupling antenna loop, and
   providing that the Beenakker resonant cavity is set at a predefined value of its Q factor by embodying the coupling antenna loop and/or said wire optionally attached to the coupling antenna loop in a metal or metal alloy different than copper and with a higher resistivity than copper ($1.724 \times 10^{-8}$ ohm·m), or providing that at least at part of its surface area the coupling antenna loop and/or said wire is coated with a metal or metal alloy different than copper and with a higher resistivity than copper ($1.724 \times 10^{-8}$ ohm·m).

7. The method according to claim 6, comprising embodying the coupling antenna loop and/or said wire optionally attached to the coupling antenna loop in a metal or metal alloy, or embodying the coupling antenna loop and/or said wire at least at part of its surface area with a coating of a metal or metal alloy having a resistivity in the range of $4.0\text{-}17.0 \times 10^{-8}$ ohm·m.

8. The method according to claim 6, comprising providing that the coupling antenna loop and/or or said wire optionally attached to the coupling antenna loop is made of a metal or coated with a metal selected from the group consisting of cadmium, chromium, cobalt, iron, iridium, lithium, magnesium, molybdenum, nickel, niobium, osmium, palladium, platinum, selenium, tantalum, tin, tungsten, and any alloy of these materials.

9. The method according to claim 8, comprising providing that the metal of the coupling antenna loop and/or said wire optionally attached to the coupling antenna loop is made of tin-coated copper.

10. The method according to claim 6, comprising disturbing an electrical field in the Beenakker cavity by mounting a clip on the coupling antenna loop and/or or said wire optionally attached to the coupling antenna loop.

11. A Beenakker cavity comprising a coupling antenna loop configured to reduce the quality factor of the Beenakker cavity, wherein the coupling antenna loop comprises a metal or metal alloy different than copper and with a higher resistivity than copper ($1.724 \times 10^{-8}$ ohm·m), or that at least at part of a surface area of the coupling antenna loop comprises a coating of a metal or metal alloy different than copper and with a higher resistivity than copper ($1.724 \times 10^{-8}$ ohm·m), wherein the Beenakker cavity comprises dimensions such that its resonant frequency is about 2.45 GHz.

12. The Beenakker cavity according to claim 11, wherein the coupling antenna loop is made in a metal or metal alloy or has at least part of its surface area a coating of a metal or metal alloy with a resistivity in the range of $4.0\text{-}17.0 \times 10^{-8}$ ohm·m.

13. The Beenakker cavity according to claim 11, wherein the coupling antenna loop is made of a metal or coated with a metal selected from the group consisting of cadmium, chromium, cobalt, iron, iridium, lithium, magnesium, molybdenum, nickel, niobium, osmium, palladium, platinum, selenium, tantalum, tin, tungsten, and any alloy of these materials.

14. The Beenakker cavity according to claim 13, wherein the metal of the coupling antenna loop is tin-coated copper.

15. The Beenakker cavity according to claim 11, wherein an electrical field disturbing clip is mounted on the coupling antenna loop.

16. The Beenakker cavity according to claim 11, wherein the coupling antenna loop is provided with a wire attached to the coupling antenna loop.

17. The Beenakker cavity according to claim 16, wherein the wire is implemented in a metal or metal alloy different than copper and with a higher resistivity than copper ($1.724 \times 10^{-8}$ ohm·m), or is at least in part provided with a coating of a metal or metal alloy different than copper and with a higher resistivity than copper ($1.724 \times 10^{-8}$ ohm·m).

18. The Beenakker cavity according to claim 16, wherein the wire is made in a metal or metal alloy or has at least at part of its surface area a coating of a metal or metal alloy with a resistivity in the range of $4.0\text{-}17.0 \times 10^{-8}$ ohm·m.

19. The Beenakker cavity according to claim 16, wherein the wire is made of a metal or coated with a metal selected from the group consisting of cadmium, chromium, cobalt, iron, iridium, lithium, magnesium, molybdenum, nickel, niobium, osmium, palladium, platinum, selenium, tantalum, tin, tungsten, or any alloy of these materials.

20. The Beenakker cavity according to claim 16, wherein the metal of the wire is tin-coated copper.

21. The Beenakker cavity according to claim 16, wherein an electrical field disturbing clip is mounted on the wire.

* * * * *